US008654006B2

(12) United States Patent
Landez et al.

(10) Patent No.: US 8,654,006 B2
(45) Date of Patent: Feb. 18, 2014

(54) INTEGRATED CIRCUIT COMPRISING FREQUENCY GENERATION CIRCUITRY FOR CONTROLLING A FREQUENCY SOURCE

(75) Inventors: Christophe Landez, Toulouse (FR); Hugues Beaulaton, Toulouse (FR); Thierry Cassagnes, Tournefeuille (FR); Stephane Colomines, Toulouse (FR); Robert G. Gach, Seysses (FR); Akbar Ghazinour, Ottobrunn (DE); Hao Li, Poing (DE); Gilles Montoriol, Cugnaux (FR); Didier Salle, Toulouse (FR); Pierre Savary, Muret (FR)

(73) Assignee: Freescale Semiconductor, Inc., Austin, TX (US)

( * ) Notice: Subject to any disclaimer, the term of this patent is extended or adjusted under 35 U.S.C. 154(b) by 155 days.

(21) Appl. No.: 13/145,122

(22) PCT Filed: Feb. 13, 2009

(86) PCT No.: PCT/IB2009/052310
§ 371 (c)(1),
(2), (4) Date: Jul. 19, 2011

(87) PCT Pub. No.: WO2010/092438
PCT Pub. Date: Aug. 19, 2010

(65) Prior Publication Data
US 2011/0285575 A1    Nov. 24, 2011

(51) Int. Cl.
*G01S 7/28* (2006.01)
(52) U.S. Cl.
USPC ............. 342/103; 342/70; 342/129; 342/134

(58) Field of Classification Search
USPC ................... 342/70, 103, 128–132, 134–135, 342/200–204
See application file for complete search history.

(56) References Cited

U.S. PATENT DOCUMENTS

| 5,187,484 | A | * | 2/1993 | Stove ............................ 342/200 |
| 5,642,066 | A | * | 6/1997 | Burke ............................ 327/132 |
| 6,114,985 | A | * | 9/2000 | Russell et al. ................ 342/169 |
| 6,211,747 | B1 | | 4/2001 | Trichet et al. |
| 6,420,998 | B2 | | 7/2002 | Winter et al. |

(Continued)

FOREIGN PATENT DOCUMENTS

| EP | 0659313 B1 | 7/1997 |
| EP | 1458089 A1 | 9/2004 |

(Continued)

OTHER PUBLICATIONS

International Search Report and Written Opinion correlating to PCT/IB2009/052310 dated Feb. 5, 2010.

(Continued)

*Primary Examiner* — John B Sotomayor

(57) ABSTRACT

An integrated circuit comprises frequency generation circuitry for controlling a frequency source for an automotive radar system. The frequency generation circuitry comprises a Phase Locked Loop (PLL) arranged to generate a control signal for controlling the frequency source, a fractional-N divider located within a feedback loop of the PLL, and frequency pattern control logic operably coupled to the fractional-N divider and arranged to control the fractional-N divider, by way of a frequency control signal, such that the PLL generates a Frequency Modulated Continuous Wave (FMCW) control signal.

20 Claims, 6 Drawing Sheets

(56) References Cited

U.S. PATENT DOCUMENTS

| | | | |
|---|---|---|---|
| 6,545,634 B1 | 4/2003 | Heide et al. | |
| 6,621,449 B1 | 9/2003 | Kunert | |
| 6,703,969 B2 | 3/2004 | Winter et al. | |
| 6,714,089 B2 * | 3/2004 | Ammar et al. | 331/107 DP |
| 7,215,215 B2 | 5/2007 | Hirano et al. | |
| 7,307,487 B2 | 12/2007 | Mayer et al. | |
| 7,573,420 B2 * | 8/2009 | Forstner et al. | 342/175 |
| 7,587,179 B1 | 9/2009 | Groe et al. | |
| 7,804,369 B2 * | 9/2010 | Saunders | 331/25 |
| 7,920,033 B1 | 4/2011 | Groe et al. | |
| 8,004,327 B2 * | 8/2011 | Hongo | 327/156 |
| 8,476,945 B2 * | 7/2013 | Elad et al. | 327/156 |
| 2003/0043950 A1 | 3/2003 | Hansen et al. | |
| 2003/0078016 A1 | 4/2003 | Groe et al. | |
| 2004/0178946 A1 | 9/2004 | Kato et al. | |
| 2005/0207334 A1 | 9/2005 | Hadad | |
| 2006/0109155 A1 | 5/2006 | Jensen | |
| 2007/0019711 A1 | 1/2007 | Mallinson et al. | |
| 2007/0164828 A1 | 7/2007 | Uozumi et al. | |
| 2008/0278370 A1 * | 11/2008 | Lachner et al. | 342/200 |
| 2009/0295620 A1 * | 12/2009 | Greendale et al. | 342/28 |
| 2010/0073222 A1 * | 3/2010 | Mitomo et al. | 342/175 |
| 2010/0213993 A1 * | 8/2010 | Hongo | 327/156 |
| 2010/0245160 A1 * | 9/2010 | Sakurai et al. | 342/200 |
| 2011/0285575 A1 * | 11/2011 | Landez et al. | 342/70 |
| 2011/0298506 A1 * | 12/2011 | Salle et al. | 327/156 |
| 2012/0062297 A1 * | 3/2012 | Keaveney et al. | 327/159 |
| 2012/0112806 A1 * | 5/2012 | Dayi | 327/145 |
| 2012/0146845 A1 * | 6/2012 | Chen et al. | 342/200 |
| 2012/0200453 A1 * | 8/2012 | Brosche | 342/175 |
| 2012/0242383 A1 * | 9/2012 | Elad et al. | 327/156 |
| 2012/0268215 A1 * | 10/2012 | Musch et al. | 331/18 |
| 2013/0082790 A1 * | 4/2013 | Trivedi et al. | 331/117 FE |
| 2013/0187719 A1 * | 7/2013 | Beaulaton et al. | 331/16 |
| 2013/0207700 A1 * | 8/2013 | Trotta | 327/157 |

FOREIGN PATENT DOCUMENTS

| | | | |
|---|---|---|---|
| EP | 1458100 B1 | | 1/2006 |
| JP | 2010071899 A | * | 4/2010 |
| WO | 99/14850 A1 | | 3/1999 |
| WO | 2007/030912 A1 | | 3/2007 |
| WO | 2010/092491 A2 | | 8/2010 |

OTHER PUBLICATIONS

Non-Final Office Action mailed Jan. 14, 2013 for U.S. Appl. No. 13/145,125, 16 pages.

* cited by examiner

US 8,654,006 B2

INTEGRATED CIRCUIT COMPRISING FREQUENCY GENERATION CIRCUITRY FOR CONTROLLING A FREQUENCY SOURCE

FIELD OF THE INVENTION

The field of the invention relates to frequency generation circuitry for controlling a frequency source, and in particular to frequency generation circuitry for controlling a frequency source for an automotive radar system.

BACKGROUND OF THE INVENTION

In the automotive industry, it is known to provide vehicles with radar systems. For example a short range radar system may be provided to aid a driver of the vehicle in determining a distance between the vehicle and nearby objects, such as other vehicles during, say, a parking manoeuvre or the like. Additionally, a longer range radar system may be provided for use with an adaptive cruise control system, whereby the cruise control system maintains a substantially constant distance between the vehicle in which the system is provided and a vehicle in front. Typically, such an automotive radar system comprises a transmitter for transmitting a carrier signal within a given frequency band, for example within a microwave frequency band of between 24 and 77 GHz, and upon which a modulation is applied. The automotive radar system further comprises a receiver for receiving a reflection of the transmitted signal reflected back by a nearby object. A delay and frequency shift between the transmitted and received signals may then be measured, and a distance between the vehicle and the nearby object by which the signal was reflected, and also a speed difference between the two, may be calculated.

The transmitter frequency source used within such automotive radar systems is typically provided by a voltage controlled oscillator (VCO). A problem with the use of VCOs is that their frequency characteristics may vary depending on, by way of example, temperature, supply voltage, manufacturing process variations, etc. Furthermore, the voltage to frequency transfer function of a VCO is not perfectly linear, and the VCO phase noise may be too poor to meet system requirements.

SUMMARY OF THE INVENTION

The present invention provides an integrated circuit comprising frequency generation circuitry for controlling a frequency source for an automotive radar system, a method for controlling a frequency source, an automotive radar system and a frequency source, as described in the accompanying claims.

Specific examples of the invention are set forth in the dependent claims.

These and other aspects of the invention will be apparent from and elucidated with reference to the examples described hereinafter.

BRIEF DESCRIPTION OF THE DRAWINGS

Further details, aspects and examples of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the invention and in order not to obfuscate or distract from the teachings of the present invention.

Figure 1:
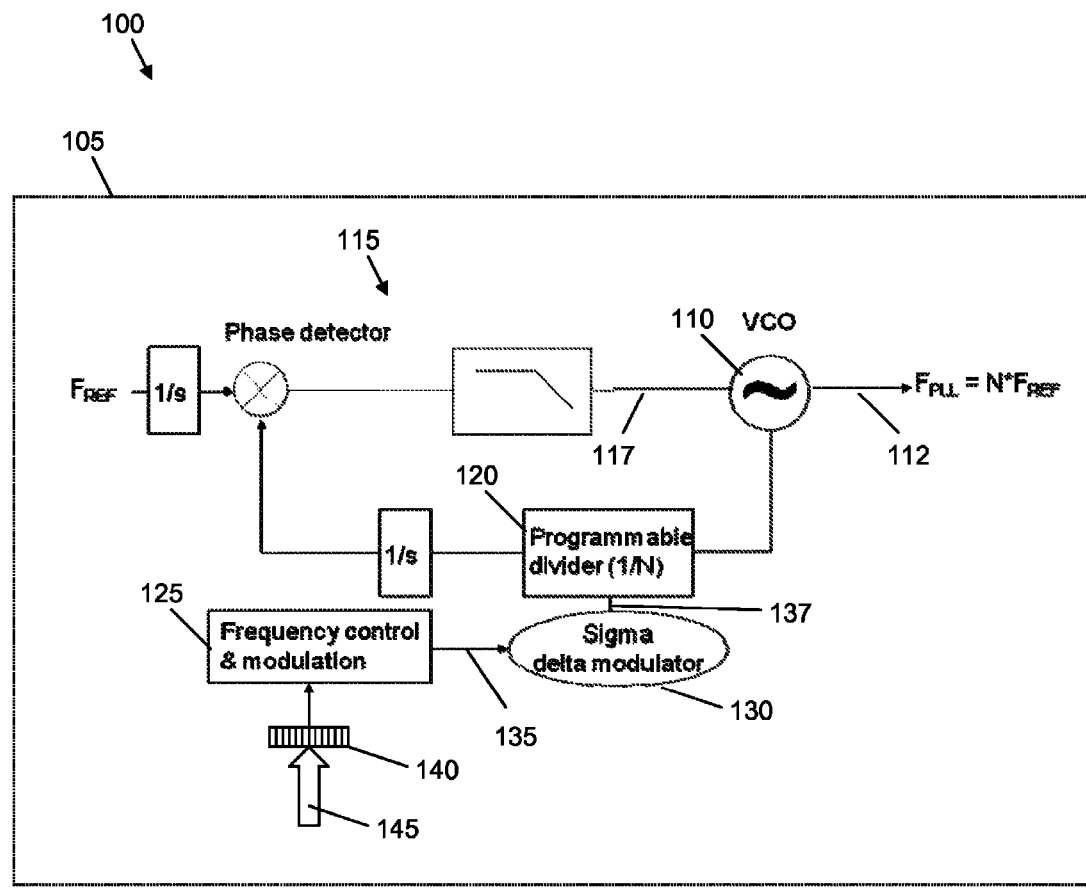
FIG. 1 illustrates an example of frequency generation circuitry for controlling a frequency for use in an automotive radar system.

Referring now to FIG. 1, there is illustrated an example of frequency generation circuitry 100, comprising a frequency source and control for controlling a frequency for use in an automotive radar system. For the illustrated example, the frequency generation circuitry 100 is provided on an integrated circuit 105. For clarity, the term 'integrated circuit' used herein may comprise a single die device, a multi-die device, a single integrated circuit package, multiple integrated circuit packages, etc. It is contemplated that the frequency generation circuitry 100 may comprise high cut-off frequency $f_T$ hetero-junction bipolar transistors produced by way of an enhanced integrated Bipolar junction transistor and complementary metal oxide semiconductor (BiCMOS) process, whereby an integrated circuit may comprise one or more CMOS modules in addition to the bipolar transistors, enabling on chip integration of complex digital control circuitry. For example, the frequency generation circuitry 100 may comprise transistors fabricated using a semiconductor material comprising a compound material made by associating silicon and germanium, which results in bipolar transistors having an operating frequency ($f_T$) up to around 200 GHz. In this manner, microwave blocks such as a voltage controlled oscillators and a medium power amplifier, high speed programmable frequency divider, a CMOS digital controller etc. may be integrated into a single semiconductor device. However, it will be appreciated that the frequency generation circuitry 100 may alternatively be provided, as a whole or in part, on a plurality of integrated circuit of semiconductor devices. Furthermore, the integrated circuit 105 may typically comprise additional circuitry and logical components that have been omitted for clarity. Furthermore, it will be appreciated that alternative techniques for realising the frequency generation circuitry 100 may alternatively used. For example, with the continued improvement in pure CMOS technology in terms of density and therefore speed, it is contemplated that future implementations of frequency generation circuitry 100 may be implemented using pure CMOS as opposed to an enhanced BiCMOS process.

The frequency source used within such automotive radar systems may be provided by a voltage controlled oscillator (VCO). A problem with the use of VCOs in such automotive radar systems is that their frequency characteristics may vary depending on, by way of example, temperature, supply voltage, manufacturing process variations, etc. Furthermore, the voltage to frequency transfer function of a VCO is not perfectly linear, and the VCO phase noise may be too poor to meet system requirements. Accordingly, in order to guarantee in-band operation and a stable frequency of operation, the control voltage for the VCO must take into account each of these variations. A further requirement for an automotive radar system intended for use by multiple automotive OEMs is an ability to apply various frequency modulation schemes depending on the automotive system and radar performance targeted. In particular, versatility may be required for frequency deviation, frequency slope, pattern generation, etc. for the modulated signal.

The frequency generation circuitry 100 comprises a Phase Locked Loop (PLL) 115 arranged to generate a control signal 117 for controlling the frequency source. For the illustrated example, the frequency source comprises a Voltage Controlled Oscillator (VCO) 110. The frequency generation circuitry 100 further comprises a fractional-N divider 120 located within a feedback loop of the PLL 115, and frequency pattern control logic 125 operably coupled to the fractional-N divider 120 and arranged to control the fractional-N divider 120 such that the PLL 115 generates a Frequency Modulated Continuous Wave (FMCW) control signal 117, thereby causing the frequency source 110 to output a Frequency Modulated Continuous Wave (FMCW) output signal 112. As will be appreciated, FMCW signals are typically used within radar systems and comprise a known stable frequency continuous wave radio energy, which is modulated by a modulation signal such that it varies gradually. In particular, FMCW signals are typically required to comprise a high degree of frequency accuracy, slope control, and linearity, with minimal and phase noise.

In this manner, the use of such a fractional-N PLL to control the frequency source for the automotive radar system enables accurate control of the mean frequency output by the frequency source, and thus precise frequency synthesis may be achieved. In particular, the variable frequency characteristics and non-linearities of the frequency source, which for the illustrated example comprises the VCO 110, may be compensated for. Furthermore, the presence of the feedback loop within the PLL enables the phase noise of the frequency source to be significantly compensated for, and thus the effects of which are significantly reduced within the output signal 112. As a result, the fractional-N PLL enables in-band operation and a stable frequency to be achieved for the automotive radar system. Additionally, the frequency pattern control logic 125 enables direct FMCW modulation of the output signal 112. Consequently, further modulation of the output signal may not be required, for example by way of further analogue modulation that may be located external to the integrated circuit 105. Furthermore, the frequency pattern control logic 125 may be implemented (for example as described in greater detail below) such that it provides versatile generation of various frequency modulation schemes.

The frequency pattern control logic 125 may be operably coupled to the fractional-N divider 120 via Sigma Delta modulation circuitry 130 (as shown in FIG. 1), and arranged to provide a frequency control signal 135 to the Sigma Delta modulation circuitry 130. The Sigma Delta modulation circuitry 130 may be arranged to modulate the frequency control signal 135 and provide a modulated control signal 137 to the fractional-N divider 120. In particular, the Sigma Delta modulation circuitry 130 of the illustrated example may be arranged to generate a pseudo random modulation that shapes the quantization noise such that the quantization noise of the fractional-N divider 120 is moved to higher frequencies. In this manner, low pass filtering characteristics of the PLL 115 substantially remove at least a part of the quantization noise. As will be appreciated, to remove the quantization noise, any alternative type of circuitry that shapes the quantization noise such that it is moved to higher frequencies may be used, for example in place of the Sigma Delta modulation circuitry 130 illustrated in FIG. 1.

Figure 2:
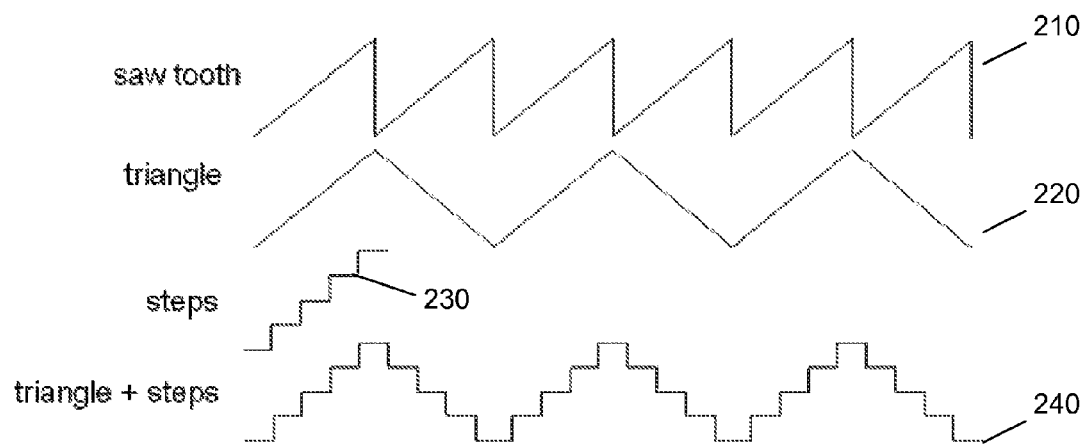
FIG. 2 illustrates examples of frequency modulation patterns for an automotive radar system.

In accordance with some examples, the frequency pattern control logic 125 may be capable of generating frequency control signals for a range of frequency modulation schemes. For example, FIG. 2 illustrates examples of frequency modulation patterns for which the frequency pattern control logic 125 may be capable of generating control signals. In FIG. 2, the frequency (vertical axis) as a function of time (horizontal axis) is shown. More particularly, FIG. 2 illustrates a saw tooth pattern 210, a triangle pattern 220, a stepped pattern 230, and a combined triangle and stepped pattern 230. The frequency patterns illustrated in FIG. 2 are intended to be illustrative and, thus, not an exhaustive selection of possible frequency patterns that may be implemented. Thus, other frequency patterns are contemplated, for example any combination of those patterns illustrated in FIG. 2.

The frequency pattern control logic 125 may be arranged to generate frequency control signals based on frequency pattern schemes comprising one or more values such as high and low frequency limit values, and/or a frequency ramp slope value. For example, illustrated in FIG. 1, the frequency pattern control logic 125 may be operably coupled to registers 140. In this manner, the high and low frequency limit values and/or frequency ramp slope value may be stored within the registers 140. The values within the registers 140 may be configured once before transmission of the radar signal, for example by way of a digital interface 145, such as a Serial Peripheral Interface (SPI). In this manner, frequency pattern control logic 125, and thereby the generation of the FMCW output signal 112, may be at least partly digitally controlled, for example by an embedded state machine (not shown) or otherwise. In this manner, the programming of the registers 140 may be controlled by application software.

Figure 3:
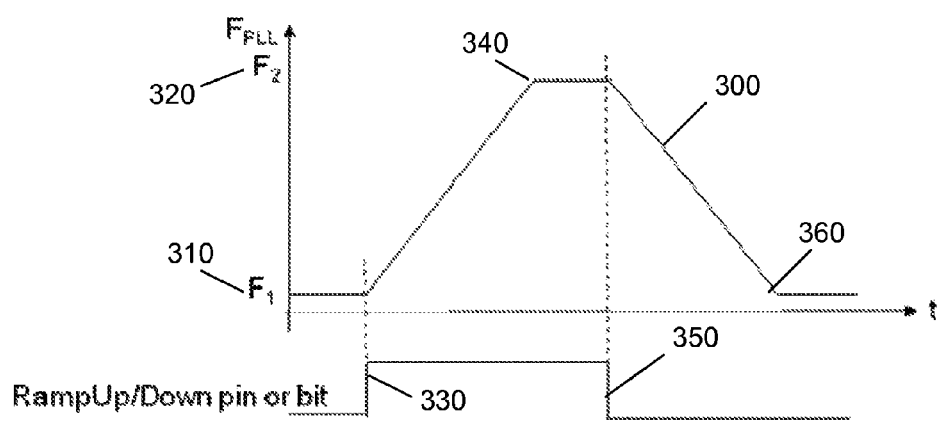
FIGS. 3 to 5 illustrate examples of the generation of frequency modulation patterns.

FIG. 3 illustrates an example of the generation of a generally triangular frequency modulation pattern 300, such as may be implemented by frequency pattern control logic 125. The generation of the frequency modulation pattern 300 is based on high and low frequency limit values, and a frequency ramp slope value. For the example illustrated in FIG. 3, the transition from a rising slope to a falling slope may be 'manually' triggered, for example by an embedded state machine (not shown) or the like, by way of a dedicated ramp up/down pin 305, or bit within the registers 140 of FIG. 1. Thus, as illustrated the frequency pattern 300 starts at a low frequency limit $F_1$ 310 defined by the low frequency limit value, with the ramp up/down pin 305 set low. The ramp up/down bit 305 is then set high at 330, transitioning the frequency modulation pattern 300 to a rising slope, the slope gradient being defined by the frequency ramp slope value. The frequency modulation pattern 300 reaches a high frequency limit $F_2$ 320, defined by the high frequency limit value, at point 340. The frequency modulation pattern 300 remains at that high frequency limit $F_2$ 320 until the ramp up/down pin 305 is set low, at 350, at which point the frequency modulation pattern 300 transitions to a falling slope, until it reaches the low frequency limit $F_1$ 310. This process may then repeat, with the general timing being dictated by the setting of the ramp up/down bit 305, whilst the high and low frequency limits and the slope gradient being defined by the respective values within the registers 140. In this manner, since write times to the registers 140 is short with respect to ramping time, the frequency modulation pattern may be modified on the fly. In an alternative example, the frequency pattern control logic 125 of FIG. 1 may be arranged to reverse the slope of the pattern (i.e. to transition from a rising slope to a falling slope and vice versa) upon the frequency modulation pattern reaching the respective high/low frequency limit. In this manner, the ramp up/down pin or bit is not required.

Figure 4:
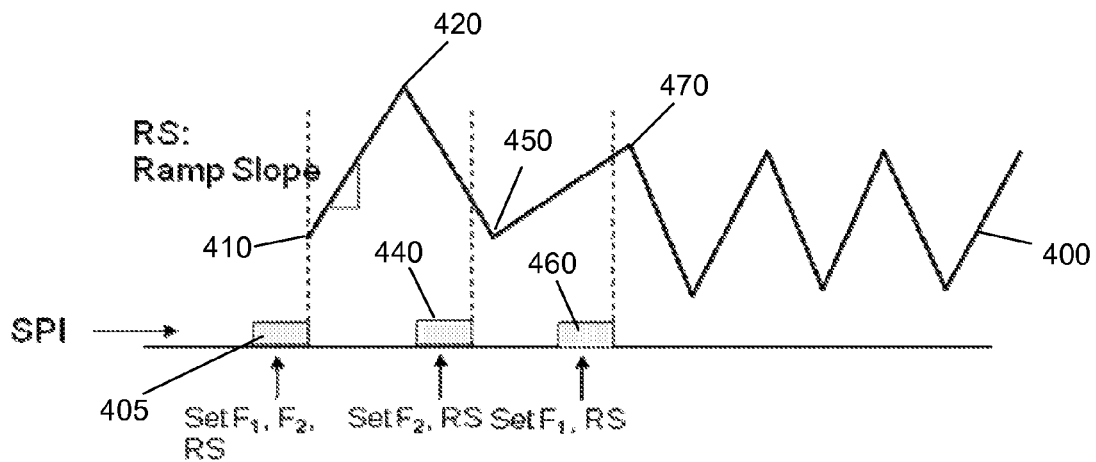

In accordance with some alternative examples, the values within the registers 140 of FIG. 1 may alternatively, or additionally, be configured on a continuous basis during transmission. FIG. 4 illustrates an alternative example of the generation of a generally triangular frequency modulation pattern 400. The generation of the frequency modulation pattern 400 is again based on high and low frequency limit values, and a frequency ramp slope value. The generation of the frequency modulation pattern 400 is initiated at point 405 with the setting of a low frequency limit value $F_1$, a high frequency limit value $F_2$ and a ramp slope value (RS), for example within registers 140 of FIG. 1. For the illustrated example, the frequency modulation pattern 400 starts at the point in time indicated with 410 at the low frequency value $F_1$, and proceeds as a rising slope comprising a slope gradient defined by the frequency ramp slope value RS. The frequency modulation pattern 400 reaches the high frequency limit $F_2$ at point 420, where for the illustrated example the frequency modulation pattern 400 automatically transitions to a falling slope. Once again, the falling slope comprises a slope gradient defined by the frequency ramp slope value RS. At point 440, the high frequency limit value $F_2$ and the slope value RS are re-programmed, for example via digital interface 145 of FIG. 1. Accordingly, when the frequency modulation pattern 400 subsequently reaches the low frequency limit value $F_1$ at point 450, the frequency modulation pattern automatically transitions to a rising slope. However, the rising slope now comprises a slope gradient defined by the re-programmed ramp slope value RS, which for the illustrated example is shallower than the previous gradient. At point 460, slope value RS is once again re-programmed, along with the low frequency limit value $F_1$. When the frequency modulation pattern 400 subsequently reaches the new high frequency limit value $F_2$ (re-programmed at point 440) at point 470, the frequency modulation pattern transitions to a falling slope. The falling slope now comprises a slope gradient defined by the (once again) re-programmed ramp slope value RS, which for the illustrated example is steeper than the previous gradient. The frequency modulation pattern 400 continues to be generated based on the low frequency limit value $F_1$, the high frequency limit value $F_2$ and the ramp slope value RS in this manner.

Figure 5:
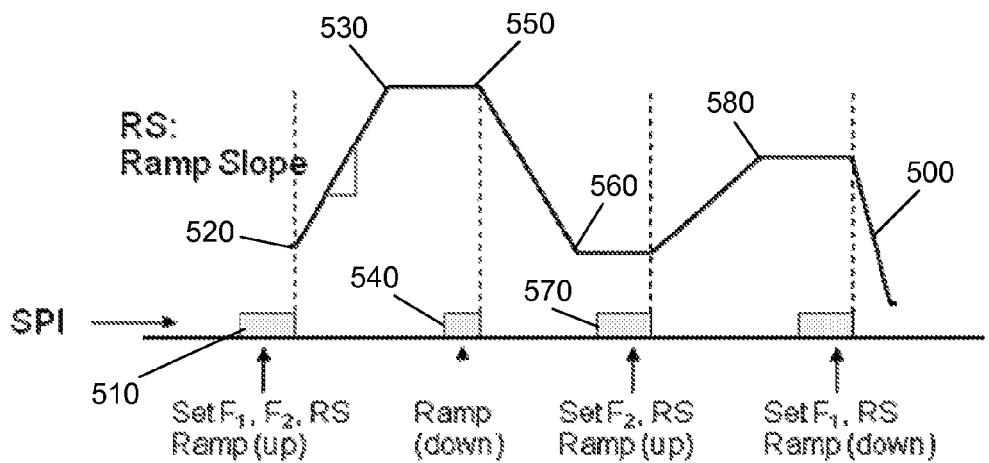

FIG. 5 illustrates a still further example of the generation of a frequency modulation pattern 500. The generation of the frequency modulation pattern 500 is once again based on high and low frequency limit values, and a frequency ramp slope value. The generation of the frequency modulation patter 500 is further based on a ramp up/down value. Accordingly, the generation of the frequency modulation pattern 500 is initiated at point 510 with the setting of a low frequency limit value $F_1$, a high frequency limit value $F_2$ and a ramp slope value RS, and with setting a ramp value to "up", for example within registers 140. For the illustrated example, the frequency modulation pattern 500 starts at point 520 at the low frequency value $F_1$, and proceeds as a rising slope comprising a slope gradient defined by the frequency ramp slope value RS. The frequency modulation pattern 500 reaches the high frequency limit $F_2$ at point 530. The frequency modulation pattern 500 remains at the high frequency limit $F_2$ until the ramp value is re-programmed to "down" at point 550, where the frequency modulation pattern 500 transitions to a falling slope. The frequency modulation pattern 500 reaches the low frequency limit $F_1$ at point 560. The frequency modulation pattern 500 remains at the low frequency limit $F_1$ until the ramp value is re-programmed to "up" at point 570. Accordingly, the frequency modulation pattern 500 transitions to a rising slope. The ramp slope value RS and the high frequency limit value $F_2$ are also re-programmed at point 570. Thus, the rising slope comprises a slope gradient according to the new ramp slope value, which for the illustrated example shallower than the previous gradient, and the frequency modulation pattern 500 rises until it reaches the new high frequency limit value F2 at point 580. The frequency modulation pattern 500 continues to be generated in this manner, with the ramp value being used to initiate transitions between rising and falling slopes, and the low frequency limit value $F_1$, high frequency limit value $F_2$ and ramp slope value RS being re-programmed as necessary in order to generate the required frequency modulation pattern.

Figure 6:
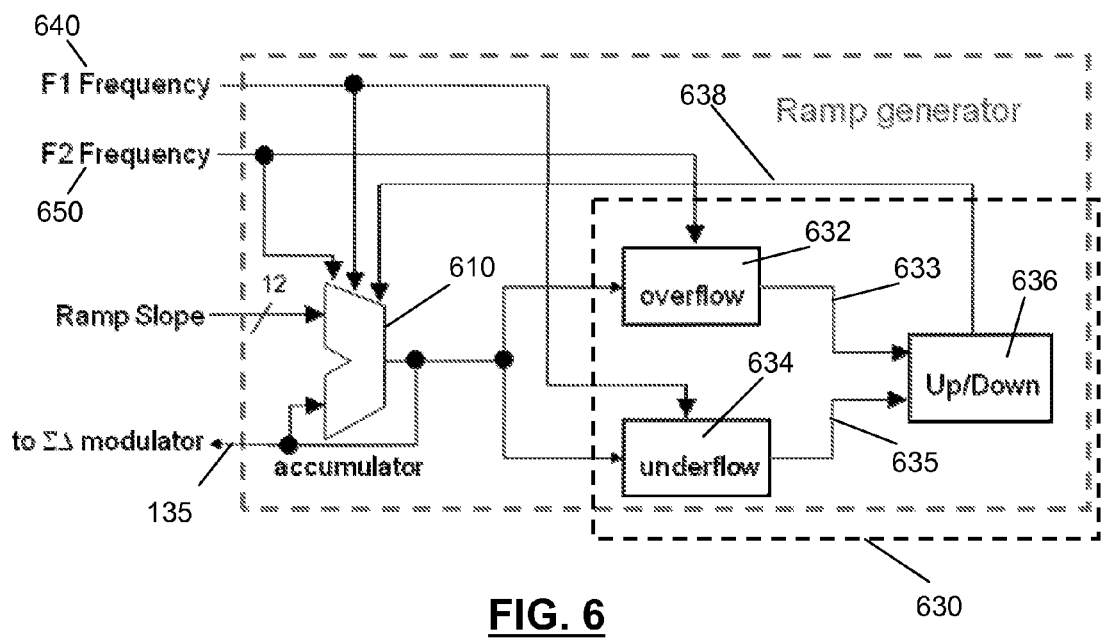
FIG. 6 illustrates an example of ramp generator logic.

Referring now to FIG. 6, there is illustrated an example of ramp generator logic 600 arranged to generate the frequency control signal 135 of FIG. 1, for example as may form a part of the frequency pattern control logic 125 of FIG. 1. For the illustrated example, the ramp generator logic 600 comprises accumulator logic 610 for incrementing or decrementing as required the frequency control signal 135 of FIG. 1 by a ramp slope value 620 each clock cycle. For the example illustrated in FIG. 6, the ramp slope value comprises a 12 bit binary value. In this manner, the accumulator logic 610 is able to apply a rising or falling frequency slope to the frequency control signal 135 of FIG. 1 in accordance with ramp slope value 620. In particular, the accumulator logic 610 receives as an input the ramp slope value 620, and outputs the frequency control signal 135 of FIG. 1. The frequency control signal 135 is fed back into a further input of the accumulator logic 610. In this manner, each clock cycle the accumulator logic 610 adds or subtracts the ramp slope value 620 from the frequency control signal 135 and outputs a new frequency control signal 135 of FIG. 1. For example, for a rising frequency slope the accumulator logic 610 adds the ramp slope value 620 to the frequency control signal 135, or for a falling frequency slope the accumulator logic 610 subtracts the ramp slope value 620 from the frequency control signal 135 of FIG. 1. The ramp generator logic 600 further receives as inputs a low frequency limit value F1 640, a high frequency limit value F2 650. In this manner, the accumulator logic 610 stops incrementing or decrementing the frequency control signal 135 when the frequency control signal 135 reaches the respective frequency limit value 640, 650.

For the illustrated example, the ramp generator logic 600 further comprises overflow detection logic 630 arranged to detect when the frequency control signal 135 reaches, in the case of an increasing frequency controls signal 135, the high frequency limit value 650, and in the case of a decreasing frequency control signal 135, the low frequency limit value 640, and upon detection of the frequency control signal 135 reaching the high or low frequency limit value 650, 640, to cause the accumulator logic 610 to transition between incrementing and decrementing the frequency control signal 135. In this manner, the ramp generator logic 600 is able to automatically transition between rising and falling frequency slopes, for example to generate a frequency modulation pattern such as that illustrated in FIG. 4.

More specifically, for the illustrated example, the overflow detection logic 630 may comprise overflow detection logic 632 and underflow detection logic 634, each of which may be arranged to receive the frequency control signal 135 of FIG. 1 output by the accumulator logic 610. The overflow detection logic 632 may be further arranged to receive the high frequency limit value 650, and upon the frequency control signal 135 reaching (e.g. being equal to) the high frequency limit value 650 to output an overflow signal 633 to up/down control logic 636. Similarly, the underflow detection logic 634 may be further arranged to receive the low frequency limit value 640, and upon the frequency control signal 135 reaching (e.g. being equal to) the low frequency limit value 640 to output an underflow signal 635 to the up/down control logic 636. The up/down control logic 636 may be arranged, upon receipt of an overflow signal 633 from the overflow detection logic 632, to cause the accumulator logic 610 to transition from incrementing the frequency control signal 135 of FIG. 1 to decrementing the frequency control signal via up/down control signal 638. Similarly, the up/down control logic 636 may be further arranged, upon receipt of an underflow signal 635 from the overflow detection logic 634, to cause the accumulator logic 610 to transition from decrementing the frequency control signal 135 to incrementing the frequency control signal via up/down control signal 638.

In some examples, the control circuitry 100 of FIG. 1 may comprise a fractional-N PLL comprising a high and wide variable division ratio (for example provided by a high speed programmable divider) in order to provide a low frequency resolution. Additionally, in some examples, the control circuitry 100 may comprise a high resolution Sigma Delta modulator (for example 28 bit) allowing a high accuracy and linearity through an increasing or decreasing frequency slope. In some examples, the fractional-N PLL may comprise a high bandwidth (for example greater than 1 MHz) for generation of fast frequency patterns, and a wide frequency control (for example provided by a wide dynamic output range phase detector) to enable maximum use of input control range of VCO whilst maximizing the frequency coverage. Additionally, in some examples, the fractional-N PLL may comprise a low phase noise (for example through optimization of component blocks). In some examples, the fractional-N PLL may comprise a wide band PLL, thereby improving the capability of the PLL to compensate for perturbation, for example caused by changes in the VCO frequency as a result of its load.

Figure 7:
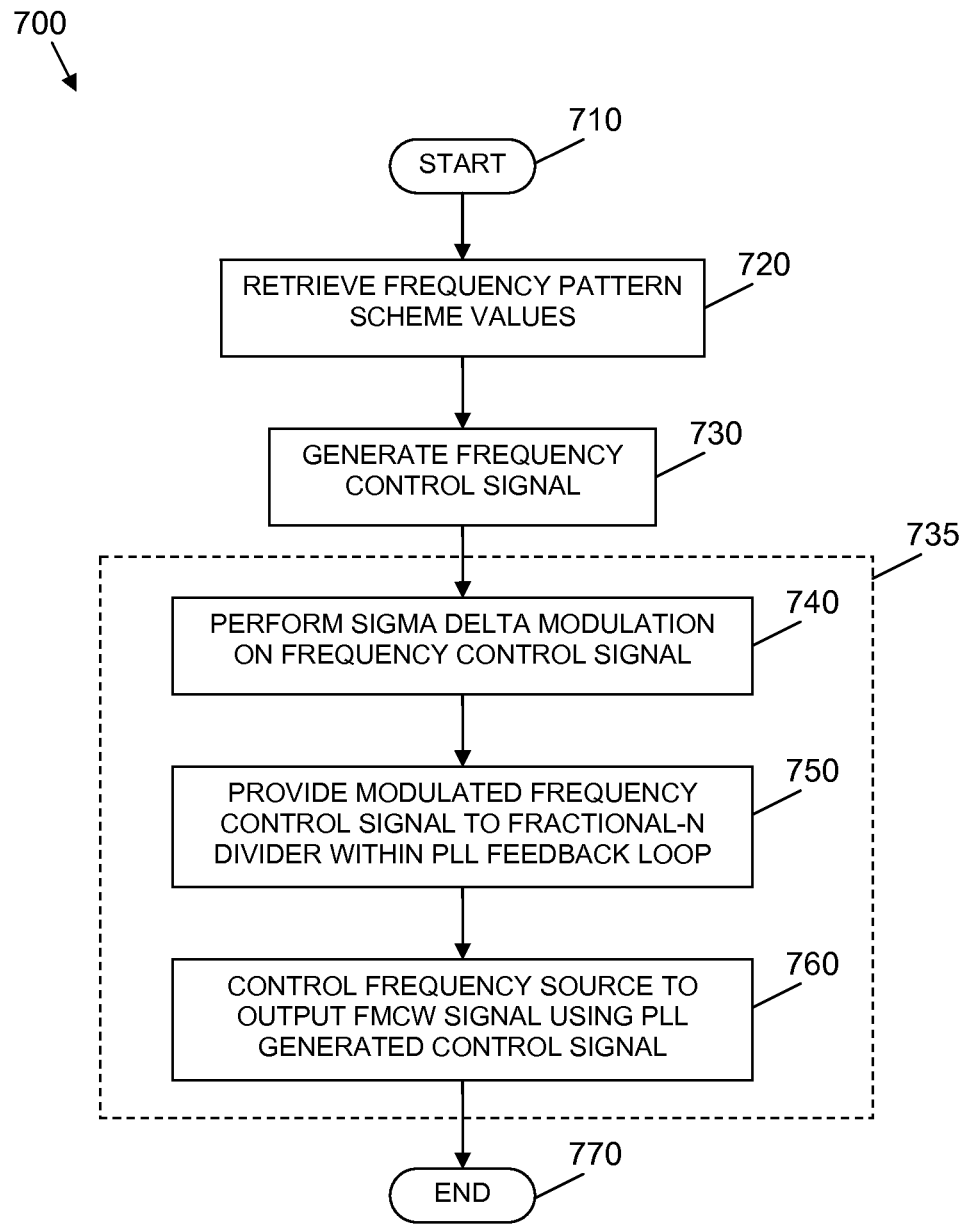
FIG. 7 illustrates an example of a flowchart of a method for controlling a frequency source for an automotive radar system.

Referring now to FIG. 7, there is illustrated an example of a flowchart 700 of a method for controlling a frequency source for an automotive radar system according to some embodiments of the present invention. The method starts at step 710, and for the illustrated example moves on to step 720 where frequency pattern scheme values are retrieved. For example, as mentioned above, high and low frequency limit values and a frequency ramp slope value may be retrieved from a register or the like. Next, in step 730, a frequency control signal is generated, for example based on the retrieved frequency pattern scheme values. The frequency control signal is then used to cause the frequency source to output a Frequency Modulated Continuous Wave (FMCW) output signal, as illustrated at 735. For the illustrated example, this is achieved by way of steps 740, 750 and 760, whereby sigma delta modulation is performed on the frequency control signal, in step 740, the modulated frequency control signal is then provided to a fractional-N divider in a feedback loop of a phase locked loop (PLL) in step 750. The frequency source is then controlled using the PLL generated control signal in step 760. Notably, the frequency control signal generated in step 730 is arranged such that the PLL causes the frequency source to output a Frequency Modulated Continuous Wave (FMCW) output signal. For clarity, steps 740, 750 and 760 have been illustrated in FIG. 7 as being performed sequentially. However, as will be appreciated by a skilled artisan, in practice the steps of 740, 750 and 760 may typically be performed simultaneously, since the sigma delta modulation requires feedback from the fractional-N divider whilst the PLL is operational. The method then ends at step 770.

Figure 8:
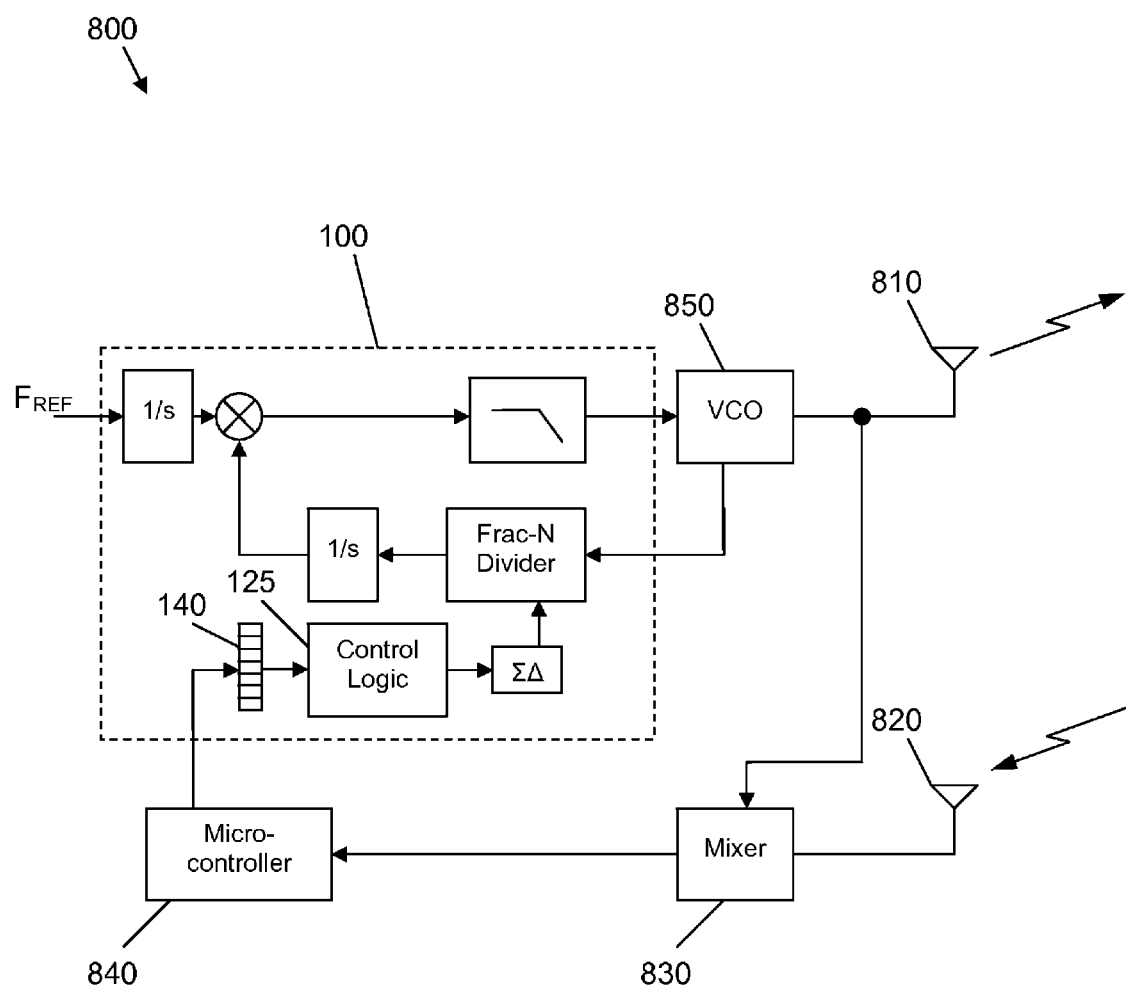
FIG. 8 illustrates an example of an automotive radar system.

Referring now to FIG. 8, there is illustrated an example of an automotive radar system 800. The radar system 800 comprises a transmitter 810 for transmitting a carrier signal within a given frequency band, for example within a microwave frequency band of between 24 and 77 GHz, and upon which a modulation is applied. The automotive radar system 800 further comprises a receiver 820 for receiving a reflection of the transmitted signal reflected back by a nearby object. The received reflected signal is mixed with the transmitted signal by mixer 830. A delay and frequency shift between the transmitted and received signals may then be measured. Thereafter, a distance between the vehicle and the nearby object by which the signal was reflected, and also a speed difference between the two, may be calculated by microcontroller 840. The automotive radar system 800 further comprises a frequency source, which for the illustrated example comprises VCO 110, and the frequency generation circuitry 100 of FIG. 1 for controlling the VCO 110. For the illustrated example, the frequency pattern control logic 125 of the frequency generation circuitry 100 of FIG. 1 may be configured, for example by way of high and low frequency limit values and a frequency ramp slope value within register 140 of FIG. 1, by microcontroller 840.

In the foregoing specification, the invention has been described with reference to specific examples of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

The conductors as discussed herein may be illustrated or described in reference to being a single conductor, a plurality of conductors, unidirectional conductors, or bidirectional conductors. However, different examples may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative examples may include multiple instances of a particular operation, and the order of operations may be altered in various other examples.

The invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit comprising:
   frequency generation circuitry for controlling a frequency source for use in an automotive radar system, the frequency generation circuitry comprising:
      a Phase Locked Loop (PLL) arranged to generate a control signal for controlling the frequency source;
      a fractional-N divider located within a feedback loop of the PLL; and
      frequency pattern control logic operably coupled to the fractional-N divider and arranged to control the fractional-N divider by way of a frequency control signal, such that the PLL generates a Frequency Modulated Continuous Wave (FMCW) control signal.

2. The integrated circuit of claim wherein
   the frequency pattern control logic is operably coupled to the fractional-N divider Sigma Delta modulation circuitry, and arranged to provide the frequency control signal to the Sigma Delta modulation circuitry; and
   the Sigma Delta modulation circuitry is being arranged to modulate the frequency control signal and provide a modulated control signal to the fractional-N divider.

3. The integrated circuit of claim 1 wherein the frequency pattern control logic is configured to generate frequency control signals for a range of frequency modulation schemes.

4. The integrated circuit of claim 3 wherein the frequency pattern control logic is configured to generate frequency control signals for at least one of a group of:
   a saw tooth frequency pattern;
   a triangle frequency pattern;
   a stepped frequency pattern; and
   a combined triangle and stepped pattern.

5. The integrated circuit of claim 1 wherein the frequency pattern control logic is arranged to generate a frequency control signal based on a frequency pattern scheme comprising at least one of high and low frequency limit values and a frequency ramp slope value.

6. The integrated circuit of claim 1 wherein the frequency pattern control logic is at least partly controlled by way of values stored within at least one register.

7. The integrated circuit of claim 6 wherein the at least one register is programmable by way of a digital interface.

8. The integrated circuit of claim 1 wherein the frequency pattern control logic is at least partly controlled by way of an embedded state machine.

9. The integrated circuit of claim 1 wherein the frequency pattern control logic is at least partly controlled by way of a dedicated up/down pin or bit.

10. The integrated circuit of claim 1 wherein the frequency pattern control logic comprises:
    ramp generator logic arranged to generate the frequency control signal, wherein the ramp generator logic comprises accumulator logic arranged to increment or decrement the frequency control signal by a ramp slope value each clock cycle.

11. The integrated circuit of claim 10 wherein the ramp generator logic further comprises:
    overflow detection logic arranged to
       detect when the frequency control signal reaches, in the case of an increasing frequency control signal, a high frequency limit value, and in the case of a decreasing frequency control signal, a low frequency limit value, and
       upon detection of the frequency control signal reaching the high or low frequency limit value, cause the accumulator logic to transition between incrementing and decrementing the frequency control signal.

12. The integrated circuit of claim 1 wherein the frequency generation circuitry comprises a fractional-N PLL comprising at least one characteristic from a group of: a high and wide variable division ratio, a high resolution Sigma Delta modulator, a high bandwidth, wide frequency control, and low phase noise.

13. A method for controlling a frequency source for an automotive radar system, the method comprising:
    generating a frequency control signal;
    providing the frequency control signal to a fractional-N divider within a feedback loop of a phase locked loop (PLL); and
    controlling the frequency source with a control signal generated by the PLL, wherein the frequency control signal is arranged such that the PLL causes the frequency source to output a Frequency Modulated Continuous Wave (FMCW) output signal.

14. The method of claim 13 further comprising:
    generating frequency control signals for a range of frequency modulation schemes.

15. An automotive radar system comprising frequency generation circuitry for controlling a frequency source therefor, the control circuitry comprising:
    a Phase Locked Loop (PLL) arranged to generate a control signal for controlling the frequency source;
    a fractional-N divider located within a feedback loop of the PLL; and frequency pattern control logic operably coupled to the fractional-N divider and arranged to control the fractional-N divider, by way of a frequency control signal, such that the PLL causes the frequency source to output a Frequency Modulated Continuous Wave (FMCW) output signal.

16. The automotive radar system of claim 15, wherein
the frequency pattern control logic is operably coupled to the fractional-N divider via Sigma Delta modulation circuitry, and arranged to provide the frequency control signal to the Sigma Delta modulation circuitry; and
the Sigma Delta modulation circuitry is arranged to modulate the frequency control signal and provide a modulated control signal to the fractional-N divider.

17. The integrated circuit of claim 15 wherein the frequency pattern control logic is configured to generate frequency control signals for a range of frequency modulation schemes.

18. The integrated circuit of claim 15 wherein the frequency pattern control logic is arranged to generate a frequency control signal based on a frequency pattern scheme comprising at least one of high and low frequency limit values and a frequency ramp slope value.

19. The integrated circuit of claim 15 wherein the frequency pattern control logic is at least partly controlled by way of values stored within at least one register.

20. The integrated circuit of claim 15 wherein the frequency pattern control logic comprises:
ramp generator logic arranged to generate the frequency control signal, wherein the ramp generator logic comprises
accumulator logic arranged to increment or decrement the frequency control signal by a ramp slope value each clock cycle.

* * * * *